(12) United States Patent
Chen et al.

(10) Patent No.: US 7,593,472 B2
(45) Date of Patent: Sep. 22, 2009

(54) METHODS AND APPARATUS FOR CIRCULATION TRANSMISSIONS FOR OFDM-BASED MIMO SYSTEMS

(75) Inventors: Jeng-Hong Chen, Temple City, CA (US); Pansop Kim, Los Angeles, CA (US)

(73) Assignee: Integrated System Solution Corp., Hsinchu (TW)

( * ) Notice: Subject to any disclaimer, the term of this patent is extended or adjusted under 35 U.S.C. 154(b) by 573 days.

(21) Appl. No.: 11/244,607

(22) Filed: Oct. 6, 2005

(65) Prior Publication Data

US 2006/0088114 A1   Apr. 27, 2006

Related U.S. Application Data

(60) Provisional application No. 60/620,724, filed on Oct. 22, 2004.

(51) Int. Cl.
*H04K 1/10* (2006.01)
(52) U.S. Cl. .................. 375/260; 455/101
(58) Field of Classification Search .......... 375/260, 375/299, 208, 267; 370/203; 455/101
See application file for complete search history.

(56) References Cited

U.S. PATENT DOCUMENTS

| | | | |
|---|---|---|---|
| 7,411,896 B1* | 8/2008 | Karsi | 370/208 |
| 2004/0101066 A1* | 5/2004 | Tarokh et al. | 375/299 |
| 2005/0013238 A1* | 1/2005 | Hansen | 370/203 |
| 2005/0159115 A1* | 7/2005 | Sandhu | 455/101 |
| 2005/0207333 A1* | 9/2005 | Rotstein et al. | 370/203 |
| 2006/0121946 A1* | 6/2006 | Walton et al. | 455/561 |
| 2008/0069255 A1* | 3/2008 | Balakrishnan et al. | 375/260 |

\* cited by examiner

*Primary Examiner*—Kevin M. Burd
*Assistant Examiner*—Leon-Viet Q Nguyen
(74) *Attorney, Agent, or Firm*—Alston & Bird LLP

(57) ABSTRACT

System performance in wireless communication is improved by increasing diversity in time, space and frequency. In OFDM-based MIMO systems in which the number of antennas M is greater then the number of simultaneously transmitted OFDM symbols N, circulation transmissions according to the present invention improve signal diversity. In symbol-based circulation transmission, N antennas are chosen from the M available antennas to transmit the N OFDM symbols. In subcarrier-based circulation transmission, M output OFDM symbols are composed from the QAM-mappled samples of the N input OFDM symbols. These M output OFDM symbols are then transmitted from the M antennas simultaneously.

3 Claims, 9 Drawing Sheets

| Pattern # \ Systems | 0 | 1 | 2 | 3 | 4 | 5 |
|---|---|---|---|---|---|---|
| 1(1) | 0 | N/A | N/A | N/A | N/A | N/A |
| 1(2) | 0 | 1 | N/A | N/A | N/A | N/A |
| 1(3) | 0 | 1 | 2 | 3 | N/A | N/A |
| 1(4) | 0 | 1 | 2 | 3 | N/A | N/A |
| 2(2) | (0,1) | N/A | N/A | N/A | N/A | N/A |
| 2(3) | (0,1) | (2,1) | (2,0) | N/A | N/A | N/A |
| 2(4) | (0,1) | (3,2) | (0,2) | (1,3) | (1,2) | (0,3) |
| 3(3) | (0,1,2) | N/A | N/A | N/A | N/A | N/A |
| 3(4) | (0,1,2) | (3,1,2) | (3,0,2) | (3,0,1) | N/A | N/A |
| 4(4) | (0,1,2,3) | N/A | N/A | N/A | N/A | N/A |

Figure 4a

| Systems | $N_{Pattern}$ | $N_t$ | |
|---|---|---|---|
| | | S_BC | Sub_BC |
| 1(1) | 1 | 1 | 1 |
| 1(2) | 2 | 2 | 1 |
| 1(3) | 3 | 3 | 1 |
| 1(4) | 4 | 4 | 1 |
| 2(2) | 1 | 2 | 2 |
| 2(3) | 3 | 6 | 2 |
| 2(4) | 6 | 12 | 2 |
| 3(3) | 1 | 3 | 3 |
| 3(4) | 4 | 12 | 3 |
| 4(4) | 1 | 4 | 4 |

| Subcarrier | 0 | 1 | 2 | 3 | 4 | 5 | 6 | 7 | 8 | 9 | 10 | ... | 45 | 46 | 47 |
|---|---|---|---|---|---|---|---|---|---|---|---|---|---|---|---|
| OFDM 0, $C_0(s)$ | A(0) | A(32) | A(64) | A(17) | A(49) | A(81) | A(2) | A(34) | A(66) | A(19) | A(51) | ... | A(31) | A(63) | A(95) |
| OFDM 1, $C_1(s)$ | A(16) | A(48) | A(80) | A(1) | A(33) | A(65) | A(18) | A(50) | A(82) | A(3) | A(35) | ... | A(15) | A(47) | A(79) |

Figure 6c

| s | 0 | 1 | 2 | 3 | 4 | 5 | 6 | 7 | 8 | 9 | 10 | ... | 45 | 46 | 47 |
|---|---|---|---|---|---|---|---|---|---|---|---|---|---|---|---|
| Pattern(s) | 0 | 1 | 2 | 1 | 2 | 0 | 2 | 0 | 1 | 0 | 1 | ... | 0 | 1 | 2 |
| $D_0(s)$ | $C_0(0)$ | × | $C_1(2)$ | × | $C_1(4)$ | $C_0(5)$ | $C_1(6)$ | $C_0(7)$ | × | $C_0(9)$ | × | ... | $C_0(45)$ | × | $C_1(47)$ |
| $D_1(s)$ | $C_1(0)$ | $C_1(1)$ | × | $C_1(3)$ | × | $C_1(5)$ | × | $C_1(7)$ | $C_1(8)$ | $C_1(9)$ | $C_1(10)$ | ... | $C_1(45)$ | $C_1(46)$ | × |
| $D_2(s)$ | × | $C_0(1)$ | $C_0(2)$ | $C_0(3)$ | $C_0(4)$ | × | $C_0(6)$ | × | $C_0(8)$ | × | $C_0(10)$ | ... | × | $C_0(46)$ | $C_0(47)$ |

Figure 6d

| s | 0 | 1 | 2 | 3 | 4 | 5 | 6 | 7 | 8 | 9 | 10 | ... | 45 | 46 | 47 |
|---|---|---|---|---|---|---|---|---|---|---|---|---|---|---|---|
| Pattern(s) | 0 | 1 | 2 | 1 | 2 | 0 | 2 | 0 | 1 | 0 | 1 | ... | 0 | 1 | 2 |
| $D_0(s)$ | A(0) | 0 | A(80) | 0 | A(33) | A(81) | A(18) | A(34) | 0 | A(19) | 0 | ... | A(31) | 0 | A(79) |
| $D_1(s)$ | A(16) | A(48) | 0 | A(1) | 0 | A(65) | 0 | A(50) | A(82) | A(3) | A(35) | ... | A(15) | A(47) | 0 |
| $D_2(s)$ | 0 | A(32) | A(64) | A(17) | A(49) | 0 | A(2) | 0 | A(66) | 0 | A(51) | ... | 0 | A(63) | A(95) |

| Pattern # Systems | 0 | 1 | 2 | 3 | 4 | 5 |
|---|---|---|---|---|---|---|
| 2(2) | (0,1) | N/A | N/A | N/A | N/A | N/A |
| 2(3) | (0,1) | (2,1) | (2,0) | N/A | N/A | N/A |
| 2(4) | (0,1) | (3,2) | (0,2) | (1,3) | (1,2) | (0,3) |

Figure 8a

| Systems | $N_t$ | |
|---|---|---|
| | S_BC | Sub_BC |
| 2(2) | 2 | 2 |
| 2(3) | 6 | 2 |
| 2(4) | 12 | 2 |

METHODS AND APPARATUS FOR CIRCULATION TRANSMISSIONS FOR OFDM-BASED MIMO SYSTEMS

CROSS-REFERENCE TO RELATED APPLICATIONS

This application claims the benefit of U.S. Provisional Application No. 60/620,724, filed Oct. 22, 2004.

BACKGROUND OF THE INVENTION

1. Field of the Invention

The present invention relates generally to wireless communication. More particularly, the present invention relates to circulation transmissions for Multiple-Input-Multiple-Output (MIMO) systems containing multiple transmitter and receiver antennas.

2. Background Art

An advantage of such MIMO systems is that by using multiple transmitter and receiver antennas to transmit and receive multiple data streams at the same time MIMO systems boost the data throughput multiple times. System performance in a MIMO system can be optimized by transmitting the data streams with a Gaussian distribution. That is, the transmitted data streams should be independent and have zero correlation. One way to achieve such independence is to try to exploit all available diversities, i.e., diversities in frequency, time and space, when transmitting the data streams. Consequently, a MIMO system realizes its best performance by exploiting the maximal randomness (or minimal correlation) of the transmitted data streams in frequency, time and space.

Due to device size limitations, antennas must be placed close to one another. Unfortunately, such proximity causes the transmitted and received data streams to be highly correlated, which, in turn, degrades system performance. Therefore, it is desirable to minimize the correlation of transmitted data streams, and thereby improve the performance of a MIMO system.

BRIEF SUMMARY OF THE INVENTION

Embodiments of the present invention improve MIMO system performance by better exploiting diversities in frequency, time and/or space. For example, according to one embodiment of the present invention, a MIMO system uses circulation transmission to minimize the correlation of transmitted data streams, thereby providing improved performance in a MIMO system.

In one embodiment, the present invention is an apparatus for use in a wireless system. The apparatus includes a convolutional encoder to input data and output encoded data bits and an interleaver to input the encoded data bits and output interleaved data bits. The interleaver interleaves encoded bits output by the convolutional encoder and increases diversity by optimizing the separations between adjacent encoded bits. One or more quadrature amplitude modulation mappers map the interleaved encoded bits to a plurality of subcarriers. A plurality of IFFT processors coupled to generate the Orthogonal-Frequency-Division-Multiplexing (OFDM) symbols from the subcarriers. A circulation transmission processor for optimizing diversity through transmission of the OFDM symbols. In one embodiment of the present invention, the circulation transmission processor performs OFDM symbol-based circulation. In another embodiment of the present invention, the circulation transmission processor performs subcarrier-based circulation. The optimized data streams are transmitted using a plurality of antennas.

In another embodiment, the present invention is a method for transmitting information in a wireless communication system. The method includes encoding input data to output encoded data bits and interleaving the output encoded bits. The method further includes mapping the interleaved encoded bits to a plurality of subcarriers and generating information symbols from the subcarriers. In addition, methods according to some embodiments of the present invention include transmitting the subcarriers and symbols so as to optimize diversity in time, space and frequency.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIG. 4a is a table illustrating circulation patterns for an S_BC system and a Sub_BC system according to an embodiment of the present invention.

FIG. 4b is a table providing the number of circulation patterns and interleaver sizes corresponding to the systems illustrated in FIG. 4b.

FIG. 5a is a schematic diagram of an exemplary 2(3) S_BC system according to an embodiment of the present invention.

FIG. 5b is a table illustrating exemplary circulation patterns to use in the 2(3) S_BC system illustrated in FIG. 5a.

FIG. 6b is a table providing an exemplary interleaver mapping for an interleaver according to an embodiment of the present invention.

FIG. 6c is a table providing exemplary Sub_BC circulations patterns for each subcarrier #s according to an embodiment of the present invention.

FIG. 6d is a table illustrating separations according to the interleaving by an embodiment of the system illustrated in FIG. 6a.

FIG. 8a is a table comprising circulation patterns that can be employed by the circulation units of FIGS. 7a and 7b according to preferred embodiments of the present invention.

FIG. 8b is a table providing interleaver sizes that can be employed according to embodiments of the present invention.

DETAILED DESCRIPTION OF THE INVENTION

Glossary

The following notations are used throughout the specification:

L—Number of OFDM symbols from convolutional encoder outputs $N_I$—Number of OFDM symbols per 3D joint Interleaver $N_{OFDM}$—Number of OFDM symbols that are transmitted simultaneously M—Number of transmitter antennas ($M \geq N_{OFDM}$)

$N_{OFDM}(M)$ system—a MIMO system (with M transmitter antennas) that transmits $N_{OFDM}$ symbols at the same time.

N—Number of receive antennas

M×N system—a MIMO system has M transmitter and N receiver antennas $N_{OFDM}(M) \times N$ system—a MIMO system (with M transmitter and N receiver antennas) that transmits $N_{OFDM}$ symbols at the same time.

$N_{CBPS}$—Number of encoded bits per OFDM symbol.

$N_{SC}$—Number of data tones (subcarriers) per OFDM symbol.

$N_{BPSC}$—Number of encoded bits per sub-carrier.

Figure 1A:
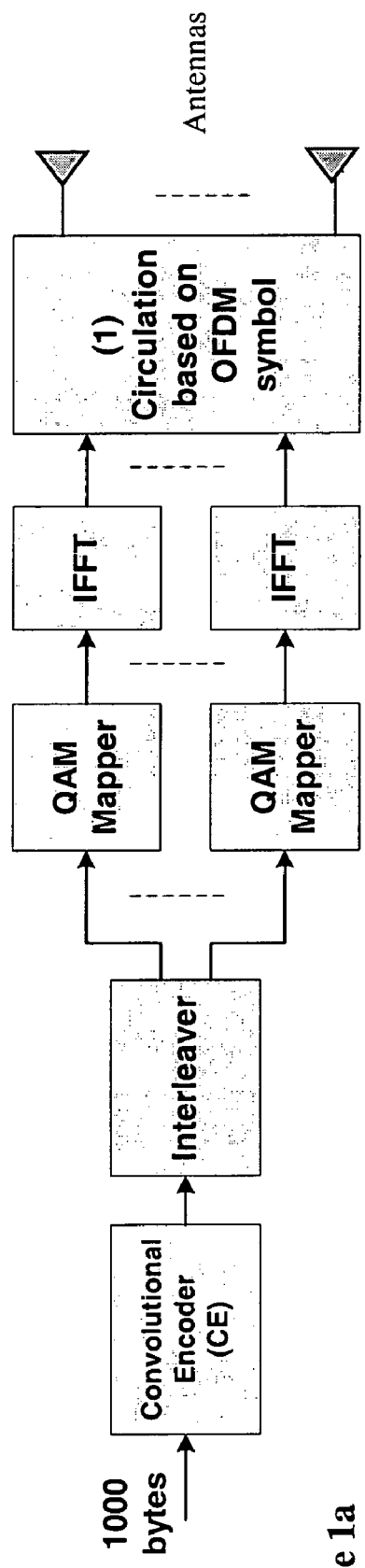
FIG. 1a is a schematic block diagram illustrating a MIMO transmitter for use in wireless communications using OFDM symbol-based circulation transmission according to an embodiment of the present invention.

FIG. 1a is a schematic block diagram illustrating a MIMO transmitter for use in a wireless communications according to an embodiment of the present invention. Despite having multiple transmitter and receiver antennas, in general a MIMO system cannot transmit and receive data at the same time. Therefore, most MIMO system designs share the same antennas to transmit and receive data. As shown in FIG. 1a, a convolutional encoder (CE) encodes a data block, for example, of 1000 bytes of data. An interleaver interleaves the bits of the encoded data. As described below, the interleaver functions to increase separation between encoded bits. A bank of parallel Quadrature Amplitude Modulation (QAM) Mappers modulates the interleaved bits to subcarriers. In the MIMO system illustrated in FIG. 1a, the outputs of the QAM mappers feed a bank of parallel Inverse-Fast-Fourier-Transform (IFFT) processors. The IFFT processors process their inputs to produce OFDM symbols. To improve spatial diversity, an OFDM-symbol circulator (described in more detail below) performs OFDM symbol based circulation on the outputs of the IFFT bank. A bank of antennas transmits the circulated data.

Figure 1B:
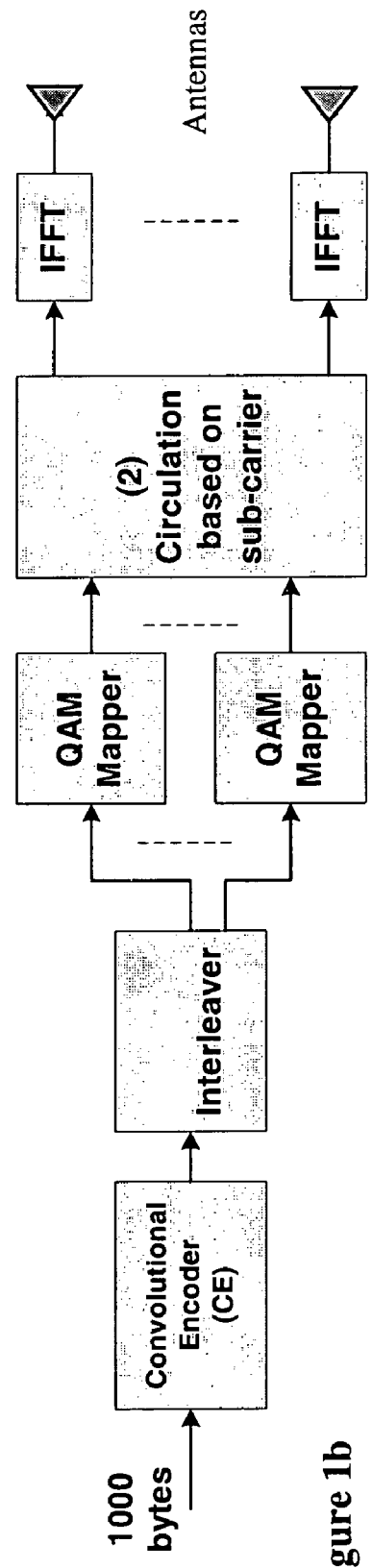
FIG. 1b is a schematic block diagram illustrating a MIMO transmitter for use in wireless communications using subcarrier-based circulation transmission according to an embodiment of the present invention.

FIG. 1b is a schematic block diagram of a MIMO system according to another embodiment of the present invention. In the MIMO system illustrated in FIG. 1b, spatial diversity is supplied by a subcarrier-based circulator. As will be discussed later, the subcarrier-based circulator operates on the output of the bank of QAM mappers and supplies the circulated data to a bank of IFFT processors. The data is then forwarded to antennas for transmission.

Since the convolutional encoder performs shift-and-add logic operations on the input data bits, its outputs are highly correlated. This is especially true for the adjacent encoded bits. Increasing the separation between any two encoded bits reduces their correlation. With sufficient separation, the correlation becomes negligible. What constitutes sufficient separation for negligible correlation depends on the selected CE code. The interleaver maximizes the separations of all encoded bits, especially for the adjacent encoded bits Another consideration with MIMO systems is that multiple antennas do not guarantee successful transmission and reception of data streams from all antennas simultaneously. For example, if the signal-to-noise-ratio (SNR) at the receiver front-end is insufficient, the number of data streams can be transmitted and received successfully is less than the total number of available antennas. For example, due to limited SNR in a 4-antenna MIMO system, it may be possible to only reliably transmit one, two, or three data streams to the receiver.

Information theory predicts that a MIMO system can achieve optimal performance by transmitting the same data from all available antennas. Consequently, in a 4-antenna MIMO system, theoretically it is best to transmit the data streams using 4 antennas, rather than just 2 antennas, for example. This is particularly true for MIMO systems used in the wireless communications where transmitted data streams pass through numerous multipaths and interferences prior to reception at another MIMO receiver. In such a case, transmitting the same data from all available antennas would provide maximal transmit diversity gain. To improve spatial diversity, all available antennas are used by introducing circular transmissions where the number of data streams to be transmitted is less than the number of available transmitter antennas. For example, FIGS. 1a and 1b illustrate two exemplary circulation transmissions that can be used according to embodiments of the present invention. FIG. 1a illustrates an example of OFDM-symbol based circulation transmission. FIG. 1b illustrates an example of subcarrier based circulation transmission.

In an OFDM based MIMO system, generally there are M IFFTs, one for each transmitter antenna. In practice, generally each IFFT has a plurality of frequency-domain inputs and time-domain outputs. For example, as shown in FIGS. 1a and 1b, each IFFT has a plurality of QAM mapped signals as its frequency-domain multiplexed inputs, each for a subcarrier.

The total available frequency bandwidth is equally divided into a plurality of sub-bands (subcarriers). Although a MIMO system can use every subcarrier (SC) to transmit QAM mapped signals, typically several outer subcarriers are not used to transmit signals in order to avoid adjacent channel interference (ACI). Furthermore, some subcarriers are reserved for pilot tones for the synchronization purpose. For example, in a particular implementation, a MIMO system using 64-point IFFTs might only use 48 subcarriers to transmit signals.

Figure 2:
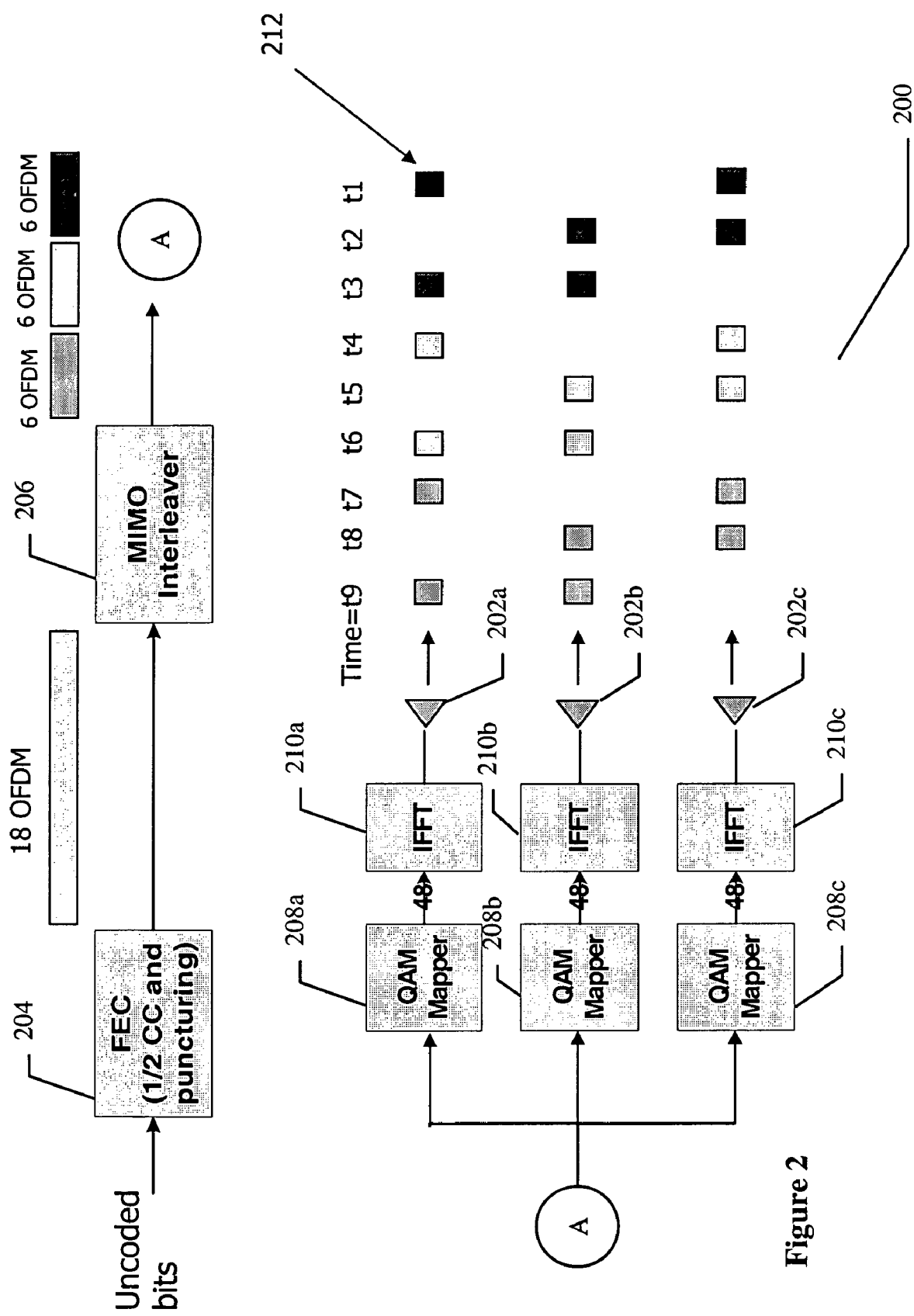
FIG. 2 is a schematic diagram illustrating an exemplary MIMO system transmitting 18 OFDM symbols from three transmitter antennas according to an embodiment of the present invention.

FIG. 2 is a schematic diagram of an exemplary example of an MIMO system 200 having three transmitter antennas 202a, 202b, and 202c that employ OFDM symbol-based circulation transmission. MIMO system 200 includes an encoder (FEC) 204. In exemplary MIMO system 200, FEC 204 outputs 18 OFDM symbols. An interleaver 206 interleaves the 18 OFDM symbols output by the FEC. For example, interleaver 206 can interleave the 18 OFDM symbols 3 times, 6 OFDM symbols at a time. The interleaved OFDM symbols are input to a bank of QAM mappers 208a, 208b, and 208c. To avoid ACI, and provide pilots subcarriers for synchronization, only 48 of the 64 available subcarriers are used to transmit data. The unused subcarriers are assigned zero values. Consequently, QAM mappers 208a, 208b and 208c modulate the interleaved data onto 48 subcarriers.

IFFTs 210a, 210b and 210c operate upon the data output by QAM mappers 208a, 208b, and 208c. Antennas 202a, 202b and 202c transmit the data output by IFFTs 210a, 210b and 210c.

As shown in FIG. 2, in the exemplary MIMO system 200, only 2 of the 3 available antennas are used simultaneously to transmit data. The remaining one antenna is turned off completely. Because not all of the antennas are used simultaneously, circulation transmission is used to improve spatial diversity. As shown in FIG. 2, the total transmission requires nine times of one OFDM symbol time. An exemplary OFDM symbol is OFDM symbol 212. It is observed that a fixed pattern is applied to select $N_{OFDM}$ out of total M available antennas for transmission.

Each OFDM symbol contains $N_{CBPS}$ encoded bits from the convolutional encoder, such as FEC 204. For example, in MIMO system 200, $N_{CBPS}=48$. The OFDM symbol mapping depends on the modulation applied by the QAM mappers. For example, in binary modulations, such as BPSK, 1 bit is mapped to a BPSK signal. In QAM modulations, such as QPSK, 2 bits are mapped to a QPSK signal. Likewise, in higher order modulations, such as 16QAM and 64QAM, 4 and 6 bits respectively are mapped to corresponding one 16QAM and one 64QAM signals. In summary, one BPSK modulated OFDM symbol contains 48×1 encoded bits from the interleaver. Likewise, a QPSK modulated OFDM symbol contains 48×2 encoded bits from the interleaver. A 16QAM modulated OFDM symbol contains 48×4 encoded bits from the interleaver. A 64QAM modulated OFDM symbol contains 48×6 encoded bits from the interleaver. Each of the resulting mappings constitutes one input (subcarrier) to an IFFT.

An OFDM-based MIMO system having M transmitter antennas can transmit at most M OFDM symbols simultaneously, one OFDM per transmitting antenna. To maximize diversity, the interleaver should randomize the correlations of all transmitted signals, i.e., $N_{CBPS} \times N_{OFDM}$ bits. For example, randomization of 48×4 bits increases diversity if four BPSK modulated OFDM symbols are transmitted at the same time. Therefore, the interleaver size ($N_I$) should be an integer multiple of the number of OFDM symbols transmitted at the same time ($N_{OFDM}$).

In exemplary MIMO system 200, the total encoded bits are contained in 18 OFDM symbols. Theoretically, optimal performance is expected if all encoded bits are interleaved and transmitted, i.e., the size of the optimal interleaver is 18 OFDM symbols. While this may be so, in some cases such an implementation may introduce significant decoding delay and buffering at receiver. The receiver must receive and de-interleave all 18 OFDM symbols before decoding the data. For a MIMO system transmitting hundreds of mega-bit-per-second (Mbps), such a design may be difficult to implement. One option is trying to randomize the total simultaneously transmitted data, i.e., $N_I = N_{OFDM}$ OFDM symbols. Another option is to increase the interleaver size to an integer multiple of $N_{OFDM}$ OFDM symbols, thereby including more randomness and diversity. In FIG. 2 for example, two OFDM symbols are transmitted simultaneously and the interleaver size is six OFDM symbols, i.e., three times the value of $N_{OFDM}$.

Some possible advantages of an OFDM-based MIMO system shown in FIG. 2 are illustrated below. For example, there are a total of $48 \times N_{OFDM}$ tones available that provide improved frequency diversity. There are three transmitter antennas available that provide improved spatial diversity. The signals are transmitted in different time slots (t1 to t9 in FIG. 2), thereby providing improved time diversity. Additional time diversity is provided by the multipath channels between the transmitter and receiver that provide the delay-and-sum of transmitted signals at receiver front-end.

Despite the advantages of adding circulation transmission to increase diversity in time, space, and frequency, a MIMO system can be further optimized. For example, the outputs from the convolutional encoder may be highly correlated, especially between adjacent encoded bits. Further, adjacent subcarriers of the same OFDM symbol may also be highly correlated. Moreover, because all antennas are built closely on the same device, the transmitted and received signal of each antenna may be highly correlated. For example, if all the antennas are built in a one-inch wide device and the distance between two MIMO devices is about 10 or 20 meter, signals transmitted or received from all antennas may be highly correlated. As a result, although an OFDM-based MIMO system may have all available diversities in frequency, space and time, the encoded symbols and transmitted signals all may be highly correlated. As a result, benefits from increasing diversity in a MIMO system may not be fully realized. However, using techniques to minimize correlations can regain the diversity benefits. For example, circulation transmissions according to embodiments of the present invention may provide a way to separate the highly correlated encoded bits into all available diversities. Embodiments of such interleavers and circulation transmission processors are described in more detail below.

In addition to the interleaver schemes discussed above, system performance can also be improved with circulation transmission (CT). Two methods of circulation transmissions (CTs) are introduced here. Furthermore, a MIMO system can implement circulation transmissions with or without an interleaver described above. However, improved system performance may be achieved by implementing both an interleaver and circulation transmission.

As noted above, having multiple antennas does not guarantee successful transmission and receipt of data streams from all antennas simultaneously. Also, system performance may be improved if the same data streams are transmitted and received from all antennas. In cases where the number of simultaneously transmitted data streams ($N_{OFDM}$) is smaller than the number of transmitter antennas (M), the circulation transmissions can be applied to achieve best system performance. In cases where the circulation transmissions are implemented, the interleaver size may be either equal to $N_{OFDM}$ or an integer multiple of $N_{OFDM}$ OFDM symbols.

Figure 3A:
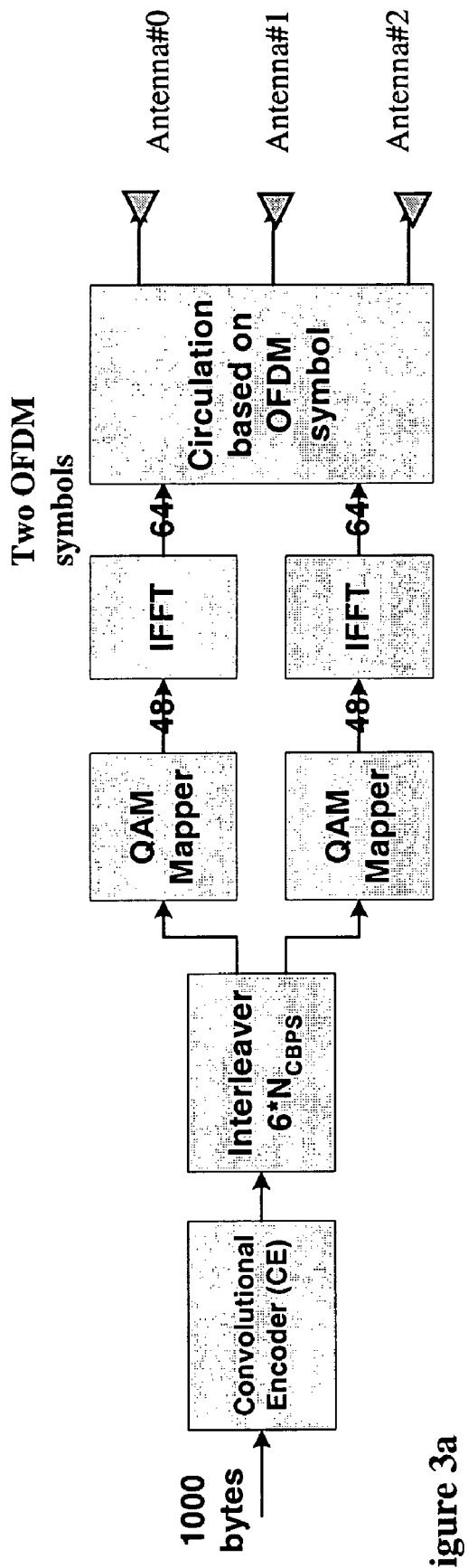
FIG. 3a is a schematic block diagram illustrating using symbol-based circulation in a MIMO system according to an embodiment of the present invention.
Figure 3B:
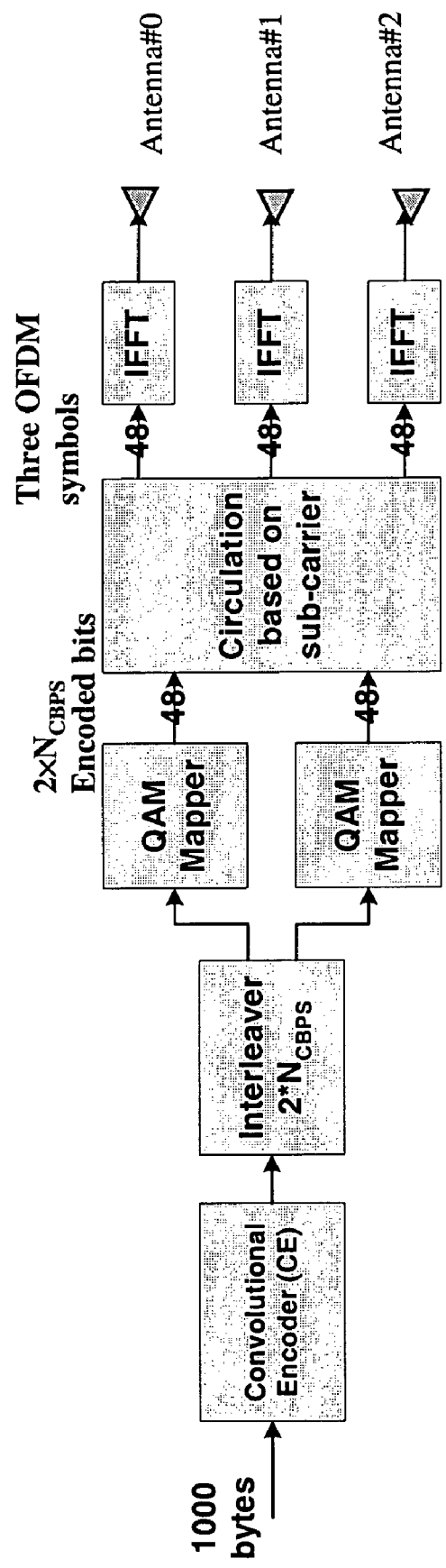
FIG. 3b is a schematic block diagram illustrating using subcarrier-based circulation in a MIMO system according to an embodiment of the present invention.

FIGS. 3a-b are schematic diagrams illustrating methods of circulation transmissions (with $N_{OFDM}=2$, and M=3) of a Circular Spatial Multiplexing (hereafter referred to as Circular SMX) MIMO system, 2(3) Circular SMX, according to embodiments of the present invention. The system of FIG. 3a performs a type of circulation transmission called OFDM symbol-based circulation (S_BC). As will be described in more detail below, in S_BC, a circulation pattern is defined for each OFDM symbol. The system of FIG. 3b performs a type of circulation transmission called subcarrier-based circulation (Sub_BC). As will be described in more detail below, in Sub_BC, a circulation pattern is defined for each subcarrier.

In FIG. 3a, only two out of three antennas transmit two OFDM symbols simultaneously. However, different pairs of antennas are selected to transmit different pairs of OFDM symbols at different times. For example, the first two OFDM symbols (#0 and #1) are transmitted by antennas #0 and #1, the OFDM symbols #2 and #3 are transmitted by antennas #0 and #2, and the OFDM symbols #4 and #5 are transmitted by antennas #1 and #2. Although only two OFDM symbols are transmitted simultaneously, it may be desirable to choose an interleaver containing six OFDM symbols, i.e., to evenly permute encoded bits for all transmitter antennas in an MIMO system.

System performance can be shown to be improved using such circulation transmission in comparison with a MIMO system transmitting two OFDM symbols from two fixed antennas. However, the benefits may come at a cost of increasing the interleaver size from two to six OFDM symbols. In addition to requiring more storage, a larger interleaver size generally incurs longer decoding delay because the receiver must pause the de-interleaving process until it receives all OFDM symbols (six in the present example). Such delay could be problematic in a MIMO system focusing on high data rate transmission (hundreds of Mbps).

The above-described example of S_BC circulation transmission employs a fixed antenna circulation pattern, i.e., antennas #0 and #1, #0 and #2, #1 and #2. This pattern is repeated u last pair of OFDM symbols is transmitted. In one example, one complete antenna circulation pattern may require three pairs of transmission or six OFDM symbols. The total number of OFDM symbols is not required to be an integer multiple of six OFDM symbols, i.e., the transmission can stop after transmitting the last pair of OFDM symbols. Also, the total number of OFDM symbols is not required to be an even number. In this case, the last OFDM symbol can be transmitted by either one of the last pair of antennas.

FIG. 3b is a schematic diagram of a MIMO system that performs subcarrier-based circulation transmission to increase diversity according to an embodiment of the present invention. Two OFDM symbols from the interleaver outputs will be transformed into three OFDM symbols for three transmitters. In other words, encoded bits for 2×48 subcarriers are transmitted from 3×48 subcarriers simultaneously, i.e., three antennas. In this embodiment of the present invention, one third of the subcarriers are zeroes. The number of encoded bits (or number of non-zero subcarriers) transmitted simultaneously in the systems illustrated in FIGS. 3a and 3b is the same. However, in the subcarrier-based system of FIG. 3b, the interleaver size is greatly reduced from six to two OFDM symbols. Moreover, antenna diversity is guaranteed since all antennas are transmitting simultaneously.

An exemplary simulation shows significant performance improvements for both S_BC and Sub_BC when compared with a MIMO system transmitting two OFDM symbols from two fixed antennas. Furthermore, in almost all cases, the performances of both S_BC and Sub_BC are about the same from computer simulations, i.e., both methods achieve the same transmit diversity.

FIG. 4a illustrates exemplary circulation patterns for a S_BC system and a Sub_BC system according to embodiments of the present invention. FIG. 4b provides circulation patterns and interleaver sizes for the corresponding systems shown in FIG. 4a. In FIGS. 4a and 4b, the MIMO system is identified as $N_{OFDM}$ (M). For example, a 2(3) MIMO system transmits 2 OFDM symbols simultaneously from 3 antennas.

The number of circulation patterns is the number of possible choices to select $N_{OFDM}$ antennas out of total M antennas, i.e., $$N_{Pattern} = \binom{M}{N_{OFDM}} = \frac{M!}{N_{OFDM}!(M-N_{OFDM})!}.$$

According to one embodiment of the present invention, to guarantee that all transmitter antennas are included (with equal share) in the same interleaver, the interleaver size for a S_BC MIMO system is $N_{pattern} \times N_{OFDM}$ OFDM symbols.

The interleaver size of a corresponding Sub_BC MIMO system is only $N_{OFDM}$ OFDM symbols to guarantee the same transmit diversity as a S_BC MIMO system. For each $N_{OFDM}$ (M) MIMO system, each choice of $N_{OFDM}$ antennas is denoted as Pattern#0, #1, . . . , #($N_{Pattern}$−1). For example, there are three choices ($N_{Pattern}$=3) of antennas antennas each choice) for a 2 (3) Circular SMX system. These patterns are as follows:

Pattern#0: antennas #0 and #1
Pattern#1: antennas #2 and #1; and
Pattern#2: antennas #2 and #0.

For an S_BC Circular SMX system, the $N_{OFDM}$ OFDM symbols are transmitted simultaneously according to the repeated Pattern #0, #1, . . . , #($N_{Pattern}$−1). The transmission stops at arbitrary Pattern #i, (i=0, 1, . . . , $N_{Pattern}$−1) when the last OFDM symbol is transmitted at this pattern. The last transmission may contain an arbitrary number of OFDM symbols j, from one to $N_{OFDM}$. The interleaver size is $N_{Pattern} \times N_{OFDM}$ OFDM symbols except the size for the last transmission is (i×$N_{OFDM}$+j) OFDM symbols. These numbers can be determined from the total number of bits (or bytes) specified in the packet header at the beginning of each transmission. Thus, both the transmitter and the receiver can calculate these numbers from the packet header without extra information and implement the correct interleaving and de-interleaving processes.

Figures 5A, 5B:
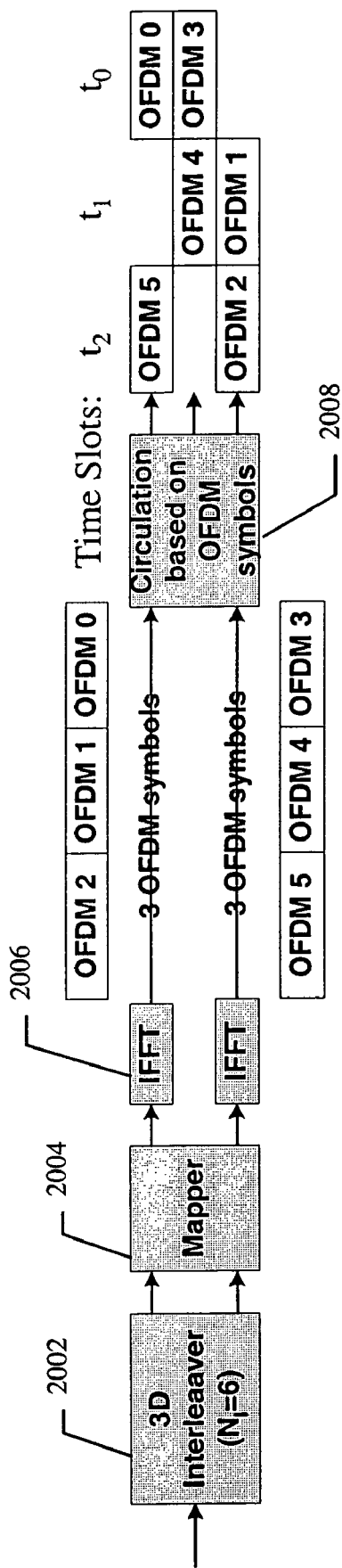

FIG. 5a is a schematic diagram of an exemplary 2 (3) S_BC Circular SMX system according to an embodiment of the present invention using data provided by the table of FIG. 4a. Data from a convolutional encoder (not shown) is fed to an interleaver 2002. The interleaved data is mapped to subcarriers by mapper 2004. The mapped data is passed though a bank of IFFTs 2006. Circulation transmission based on OFDM symbols is provided by circulation unit 2008. FIG. 5b illustrates exemplary circulation patterns for use in the 2(3) S_BC Circular SMX system illustrated in FIG. 5a.

The interleaver size is $N_{Pattern} \times N_{OFDM}$ or six OFDM symbols as indicated in the table in FIG. 4b. These six OFDM symbols are transmitted according to Patterns, #0, #1, and #2, in three time slots, $t_0$, $t_1$, and $t_2$, respectively.

Figure 6A:
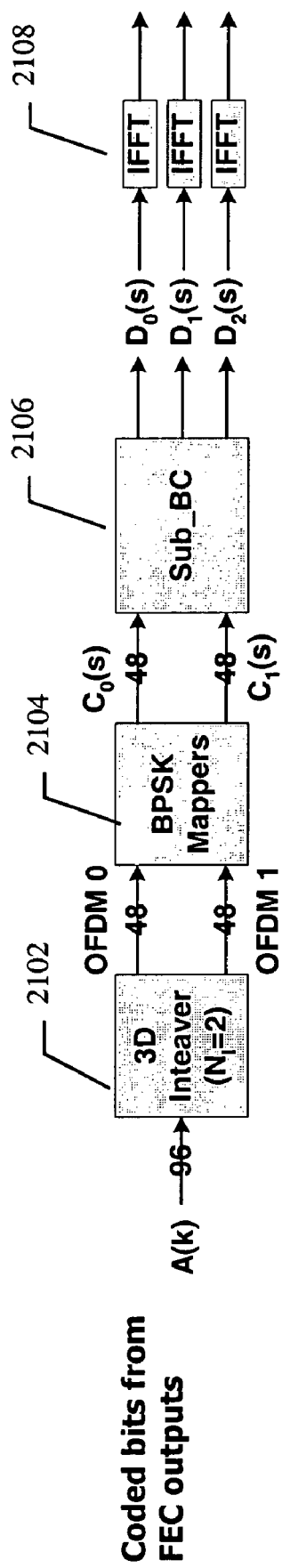
FIG. 6a is a schematic diagram of a Sub_BC 2 (3) system according to an embodiment of the present invention.

FIG. 6a is a schematic diagram of a Sub_BC 2 (3) Circular SMX system according to an embodiment of the present invention. Coded bits from a convolutional encoder are input to an interleaver 2102. FIG. 6b is a table providing an exemplary interleaver mapping for interleaver 2102 according to an embodiment of the present invention. The interleaved bits are in mapped to subcarriers by mapper 2104. In the exemplary embodiment illustrated in FIG. 6a, mapper 2104 is a BPSK mapper. In the embodiment illustrated in FIG. 6a, BPSK mapper outputs two OFDM symbols, $C_0(s)$ and $C_1(s)$, where s is the subcarrier index. Subcarrier based circulation is provided by circulation unit Sub_BC block 2106. In the embodiment illustrated in FIG. 6a, circulation unit 2106 circulates the two outputs of BPSK mapper 2104 into three sets of IFFT inputs, i.e., $D_0(s)$, $D_1(s)$, and $D_2(s)$. The outputs of three IFFTs represent the OFDM symbols to be transmitted simultaneously.

For each subcarrier #s, the Sub_BC block may take two BPSK mapped samples, i.e., $C_0(s)$ and $C_1(s)$, as input and output them to one selected pattern shown in FIG. 4a. The selected pattern, P(s), which is a function of subcarrier index s, is defined in following equation:

$$P(s)=[floor(s/N_{carrier})+(s \bmod N_{carrier})] \bmod N_{Pattern}, \quad (7)$$

where s=0, 1, 2, . . . , $N_{SC}$−1, and floor(x) is the largest integer smaller than or equal to x.

FIG. 6c is a table providing exemplary Sub_BC circulations patterns for each subcarrier#s according to an embodiment of the present invention. As shown in FIG. 6c, each selected pattern only specifies two numbers, i.e., only two ($N_{OFDM}$=2) non-zero inputs for the subcarrier #s of the three (M=3) IFFTs, $D_0(s)$, $D_1(s)$, and $D_2(s)$. In comparison, the S_BC takes $N_{OFDM}$ OFDM symbols and circulates them into M antennas (one of them is inactive) while the Sub_BC takes $N_{OFDM}$ QAM samples from each subcarrier and circulate them into M QAM samples (one of them is zero) for the same subcarrier of M OFDM symbols. FIG. 6d is a table illustrating separations according to the interleaving by an embodiment of the system illustrated in FIG. 6a.

The physical meaning of the above provided equation for P(s) is described as follows. Every $N_{carrier}$ subcarriers of all subcarriers are grouped and circulated into $N_{Pattern}$ circulation patterns which include all transmitter antennas. The first modulo operation provides an additional one-subcarrier shift in the next group of $N_{carrier}$ subcarriers. Here the number of subcarriers in a group, $N_{carrier}$, is a design parameter. $N_{carrier}$ is chosen to be 3 in the example described above to ensure a three subcarrier separation.

Figure 7A:
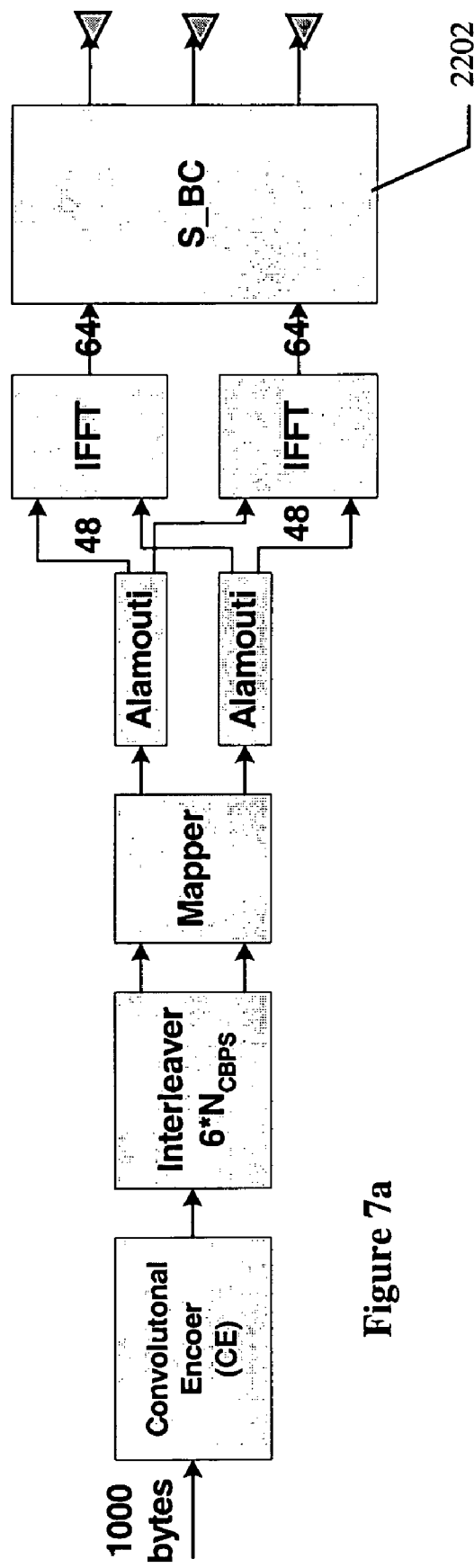
FIG. 7a is a schematic diagram of a 2(3) S_BC MIMO system using an Alamouti code according to an embodiment of the present invention.
Figure 7B:
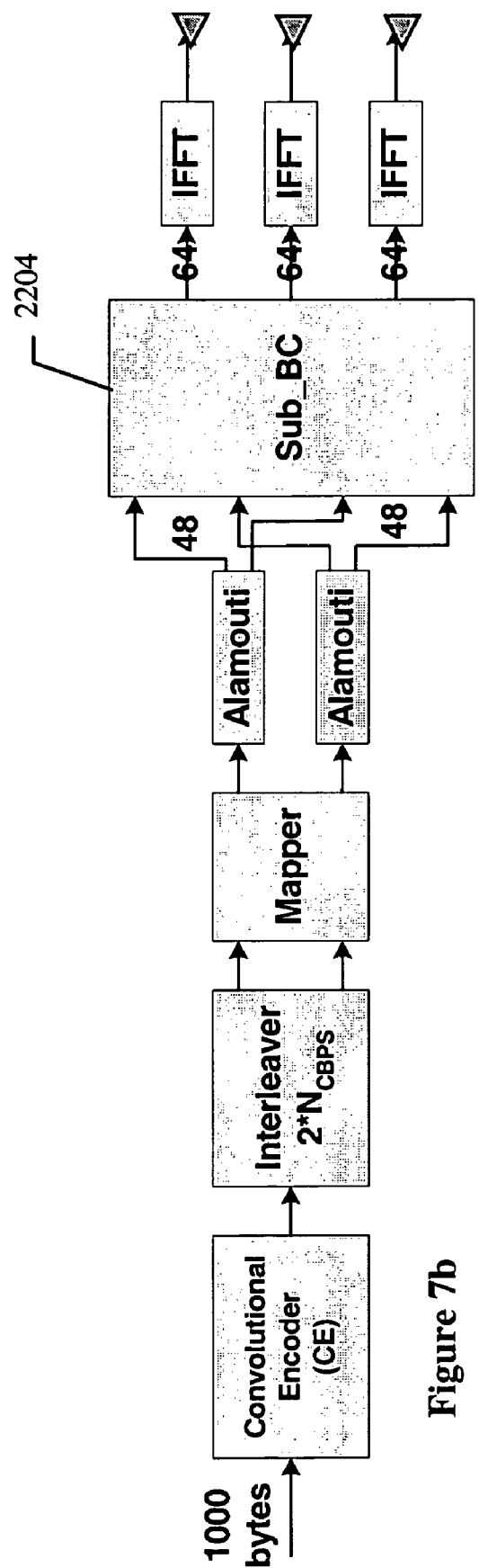
FIG. 7b is a schematic diagram of a 2(3) Sub_BC MIMO system using an Alamouti code according to an embodiment of the present invention.

Both S_BC and Sub_BC can be applied to various space time block codes (STBC) when the number of simultaneously transmitted OFDM symbols is less than the number of total transmitter antennas. One well-known such STBC is known as the Alamouti Code FIG. 7a is a schematic diagram of a 2(3) S_BC MIMO system using an Alamouti code according to an embodiment of the present invention. FIG. 7b is a schematic diagram of a 2(3) Sub_BC MIMO system using an Alamouti Code according to an embodiment of the present invention. As shown in FIGS. 7a-b, two OFDM symbols are transmitted simultaneously from the circulation units. In FIG. 7a, circulation is provides by S_BC circulation unit 2202. In FIG. 7b, circulation is provided by Sub_BC circulation unit 2204. FIG. 7a is a table comprising circulation patterns that can be employed by circulation units 2202 and 2204 according to preferred embodiments of the present invention. FIG. 7b is a table providing interleaver sizes that can be employed according to embodiments of the present invention.

The following relationships are applicable to the Circulation Transmission Alamouti code system illustrated in FIGS. 7a-b and 8a-b:

$$N_{Pattern} = \binom{M}{N_{OFDM}}$$

= Number of circulation patterns for both S_BC and sub_BC $N_I = N_{OFDM} \cdot N_{Pattern}$ for CALA systems with S_BC $N_I = N_{OFDM}$ for CALA systems with sub_BC Note that bigger $N_I$ implies a larger hardware size and longer coding delay. It can be seen that both the interleaver size and circulation patterns are the same as a Circular SMX or Circular Alamouti MIMO system. Other STBC MIMO systems (not Alamouti codes) have M antennas and transmit a smaller number, $N_{OFDM}$ OFDM symbols simultaneously can implement either S_BC or Sub_BC.

In summary, a subcarrier-based circulation transmission (Sub_BC) according to one embodiment of the present invention can be summarized with reference to FIGS. 4a-b and 8a-b. A MIMO system with M transmitter antennas is simultaneously transmits $N_{OFDM}$ OFDM symbols. The input for each subcarrier of an OFDM symbol is one QAM (mapped) sample. Each OFDM symbol contains $N_{SC}$ subcarriers with index s=0, 1, 2 ..., $N_{SC}$-1. The proposed Sub_BC transforms the inputs for $N_{OFDM}$ OFDM symbols (denoted as $C_0$, $C_1$, ..., $C_{N_{OFDM}-1}$) into inputs for M OFDM ($N_{OFDM}$<M) symbols (denoted as $D_0, D_1, \ldots, D_{M-1}$), examples of which are described below.

For each subcarrier s, $N_{OFDM}$ QAM samples are taken from $N_{OFDM}$ OFDM symbols, i.e., one QAM sample is taken from the same subcarrier s from each of the $N_{OFDM}$ OFDM symbols C's. However, M QAM samples are required for M OFDM symbols D's for the same subcarrier s. These $N_{OFDM}$ QAM samples for subcarrier s from OFDM symbols C's are mapped into the $N_{OFDM}$ (out of total M) OFDM symbols D's for the same subcarrier s. In other words, there are M QAM samples for the subcarrier s of M OFDM symbols D's, where $N_{OFDM}$ QAM samples are from OFDM symbols C's of the same subcarrier s and the rest (M-$N_{OFDM}$) QAM samples are zeros.

The mapping from $N_{OFDM}$ QAM samples of OFDM symbols C's to $N_{OFDM}$ QAM samples of OFDM symbols D's is according to a selected Pattern# defined in FIG. 4a. The selected Pattern#, P(s), is determined by the following equation:

$$P(s) = s \bmod N_{Pattern} \tag{8}$$

where s=0, 1, 2, ..., $N_{SC}$-1, is the subcarrier index.

In other words, for each subcarrier s, a selected P(s) is determined from Equation (8). The selected P(s) specifies $N_{OFDM}$ different numbers out of M numbers (from 0, 1, 2, ..., M-1) corresponding to M OFDM symbols D's. The $N_{OFDM}$ QAM samples from OFDM symbols C's are mapped into the specified $N_{OFDM}$ OFDM symbols D's according to the selected P(s) for each subcarrier s. The subcarrier s of (M-$N_{OFDM}$) OFDM symbols D's are zeros if their OFDM numbers are not specified in the specified P(s). After finishing the mapping for all subcarriers, (s=0, 1, 2, ..., $N_{SC}$-1), M new OFDM symbols D's are constructed from the $N_{OFDM}$ OFDM symbols C's.

The number of all possible patterns, $N_{Pattern}$, for an $N_{OFDM}$ (M) system is given by the following equation:

$$N_{Pattern} = \binom{M}{N_{OFDM}} = \frac{M!}{N_{OFDM}!(M - N_{OFDM}!)} \tag{9}$$

The selected P(s) is a periodic number from 0 to $N_{Pattern}$-1 due to the modulo $N_{Pattern}$ operation in Equation (8). A complete set of patterns includes all possible patterns, Pattern#0, #1, ..., #$N_{Pattern}$-1. After a complete set of patterns, equal numbers of non-zero and zero subcarriers are uniformly distributed to each OFDM symbol D's in an $N_{OFDM}$ (M) MIMO system. The selected pattern number P(s) is periodically repeated from 0 to $N_{Pattern}$-1. For example, if $N_{Pattern}$=3, the P(s)=0, 1, 2, 0, 1, 2, ..., 0, 1, 2, ... for subcarrier index s=0, 1, 2, 3, 4, 5, ...

A modification of Equation (8) is given as follows, $$\text{Pattern}(s) = [floor(s/N_{carrier}) + (s \bmod N_{carrier})] \bmod N_{Pattern} \tag{10}$$

In Equation (10), s is the subcarrier index and $N_{carrier}$ is a design parameter. According to Equation (10), every $N_{carrier}$ subcarriers is a group. The selected pattern is periodically repeated from 0 to $N_{Pattern}$-1 but with one additional pattern shift from one group to the next group of subcarriers. For example, if $N_{carrier}$=3 and $N_{Pattern}$=3, three subcarriers are in a group and the periodic pattern numbers P(s) are 0, 1, and 2.

If the Equation (10) is applied, the shifted periodic patterns becomes P(s)=0, 1, 2, 1, 2, 0, 2, 0, 1, ..., for subcarrier index s=0, 1, 2, 3, 4, 5, 6, 7, 8, .... It is observed that one additional pattern number may shift every three subcarriers.

In other embodiments of the present invention, variations to the scheme described above are implemented. For example, such alternative embodiments of the present invention may include one or more of the following implementations:

(I) An arbitrary number of pattern shifts in every $N_{carrier}$ subcarriers. The pattern shift is one in Equation (7) and can have arbitrary value from 0 to $N_{Pattern}-1$.

(II) A periodic pattern numbers including a complete set or a partial set of all possible $N_{Pattern}$ patterns. For example, for a 2(4) MIMO system, $N_{Pattern}$ is six or Patterns#0, #1, #2, ..., #5. For example, according to one embodiment of the present invention, the partial set of the patterns is #0, #1, and #2 only. A partial set of a complete set includes a smaller number of patterns from total $N_{Pattern}$ patterns. A modification based on Equations (7), (8) and (10) is given as follows:

$$\text{Pattern}(s) = [N_{shift} \times floor(s/N_{carrier}) + N_{offset} \times (s \bmod N_{carrier})] \bmod N_{Partial} \quad (11)$$

where $N_{shift}$ defines the shift in pattern number, $N_{offset}$ is the offset of subcarriers, and $N_{Partial}$ indicates that a set of periodic patterns includes a partial or all patterns from all possible patterns.

(III) Transformation of $N_{OFDM}$ OFDM symbols C's into M OFDM symbols D's "evenly" such that the total numbers of non-zero subcarriers for all C's and for all D's are the same. In addition to (III) the number of non-zero subcarriers in each OFDM D's is the same.

The foregoing disclosure of the examples of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure.

We claim:

1. A method of transmitting N.sub.OFDM input OFDM symbols in an OFDM-based MIMO system including M transmission antennas, wherein N.sub.OFDM≤M and wherein each of the M antennas has N.sub.SC subcarriers and each of the N.sub.OFDM input OFDM symbols has N.sub.SC QAM-mapped samples corresponding to the N.sub.SC subcarriers, the method comprising:

forming M output OFDM symbols from the QAM-mapped samples of the N.sub.OFDM input OFDM symbols, wherein each of the M output OFDM symbols has N.sub.SC QAM-mapped samples corresponding to the N.sub.SC subcarriers and wherein each of the M output OFDM symbols includes a plurality of QAM-mapped samples from each of the N.sub.OFDM input OFDM symbols;

forming $$N_{Pattern} = \binom{M}{N_{OFDM}} = \frac{M!}{N_{OFDM}!(M-N_{OFDM}!)}$$

distinct combinations of $N_{OFDM}$ of the M output OFDM symbols; and forming a sequence of $N_{SC}$ elements wherein each element is one of the $N_{Pattern}$ distinct combinations and assigning a combination pattern to the subcarrier according to the sequence designated as P(s)=[floor(s/$N_{pattern}$)+(s mod $N_{Pattern}$)] mod $N_{pattern}$ wherein s =0, 1, 2, ..., $N_{SC}-1$ is the subcarrier number.

2. The method as recited in claim 1, wherein forming M output OFDM symbols further comprising: for each of the N.sub.SC subcarriers, choosing N.sub.OFDM of the M output OFDM symbols; assigning the N.sub.OFDM QAM-mapped samples of the N.sub.OFDM input OFDM symbols to the N.sub.OFDM chosen output OFDM symbols; and assigning a zero QAM-mapped sample to the M–N.sub.OFDM remaining output OFDM symbol.

3. The method as recited in claim 1, including designating the sequence as P(s)=[$N_{shift}$*floor(s/$N_{carrier}$)+$N_{offset}$*(s mod $N_{carrier}$)] mod $N_{partial}$, where $N_{carrier}$ defines the number of subcarriers grouped together, $N_{shift}$ and $N_{offset}$ define the shift of the groups and the pattern numbers to be selected from all possible patterns, and $N_{partial}$ defines a set of periodic patterns that includes at least a partial number of patterns from all possible patterns.

* * * * *

UNITED STATES PATENT AND TRADEMARK OFFICE
CERTIFICATE OF CORRECTION

PATENT NO. : 7,593,472 B2
APPLICATION NO. : 11/244607
DATED : September 22, 2009
INVENTOR(S) : Chen et al.

It is certified that error appears in the above-identified patent and that said Letters Patent is hereby corrected as shown below:

Col. 11-12 Claim 1 should read as follows:

1. A method of transmitting ~~N.sub.OFDM~~ $\underline{N_{OFDM}}$ input OFDM symbols in an OFDM-based MIMO system including M transmission antennas, wherein $\underline{N_{OFDM}}$ ~~N.sub.OFDM~~ ≤ M and wherein each of the M antennas has ~~N.sub.SC~~ $\underline{N_{SC}}$ subcarriers and each of the ~~N.sub.OFDM~~ $\underline{N_{OFDM}}$ input OFDM symbols has ~~N.sub.SC~~ $\underline{N_{SC}}$ QAM-mapped samples corresponding to the ~~N.sub.SC~~ $\underline{N_{SC}}$ subcarriers, the method comprising:

forming M output OFDM symbols from the QAM-mapped samples of the ~~N.sub.OFDM~~ $\underline{N_{OFDM}}$ input OFDM symbols, wherein each of the M output OFDM symbols has ~~N.sub.SC~~ $\underline{N_{SC}}$ QAM-mapped samples corresponding to the ~~N.sub.SC~~ $\underline{N_{SC}}$ subcarriers and wherein each of the M output OFDM symbols includes a plurality of QAM-mapped samples from each of the ~~N.sub.OFDM~~ $\underline{N_{OFDM}}$ input OFDM symbols; forming $$N_{Pattern} = \binom{M}{N_{OFDM}} = \frac{M!}{N_{OFDM}!(M - N_{OFDM}!)}$$

distinct combinations of $N_{OFDM}$ of the M output OFDM symbols; and forming a sequence of $N_{SC}$ elements wherein each element is one of the $N_{Pattern}$ distinct combinations and assigning a combination pattern to the subcarrier according to the sequence designated as $P(s)=[floor(s/N_{Pattern})+(s \bmod N_{Pattern})] \bmod N_{Pattern}$ wherein $s=0, 1, 2, \ldots, N_{SC}-1$ is the subcarrier number.

Col. 12 lines 27-34 Claim 2 should read as follows:

2. The method as recited in claim 1, wherein forming M output OFDM symbols further comprising:
for each of the $\underline{N_{SC}}$ ~~N.sub.SC~~ subcarriers, choosing $\underline{N_{OFDM}}$ ~~N.sub.OFDM~~ of the M output OFDM symbols; assigning the $\underline{N_{OFDM}}$ ~~N.sub.OFDM~~ QAM-mapped samples of the $\underline{N_{OFDM}}$ ~~N.sub.OFDM~~ input OFDM symbols to the $\underline{N_{OFDM}}$ ~~N.sub.OFDM~~ chosen output OFDM symbols; and

UNITED STATES PATENT AND TRADEMARK OFFICE
CERTIFICATE OF CORRECTION

PATENT NO. : 7,593,472 B2
APPLICATION NO. : 11/244607
DATED : September 22, 2009
INVENTOR(S) : Chen et al.

It is certified that error appears in the above-identified patent and that said Letters Patent is hereby corrected as shown below:

assigning a zero QAM-mapped sample to the M-$\underline{N_{OFDM}}$ ~~N.sub.OFDM~~ remaining output OFDM symbol.

Signed and Sealed this

Tenth Day of November, 2009

David J. Kappos
*Director of the United States Patent and Trademark Office*

UNITED STATES PATENT AND TRADEMARK OFFICE
CERTIFICATE OF CORRECTION

PATENT NO. : 7,593,472 B2  Page 1 of 1
APPLICATION NO. : 11/244607
DATED : September 22, 2009
INVENTOR(S) : Chen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 924 days.

Signed and Sealed this

Twenty-first Day of September, 2010

David J. Kappos
*Director of the United States Patent and Trademark Office*